United States Patent
Liaw et al.

(10) Patent No.: US 7,449,788 B2
(45) Date of Patent: Nov. 11, 2008

(54) CHIP STRUCTURE WITH ARRANGEMENT OF SIDE PADS

(75) Inventors: Yuan-Tsang Liaw, Taipei Hsien (TW); Chi-Hsing Hsu, Taipei Hsien (TW); Hsing-Chou Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 449 days.

(21) Appl. No.: 11/403,433

(22) Filed: Apr. 12, 2006

(65) Prior Publication Data

US 2006/0261496 A1    Nov. 23, 2006

Related U.S. Application Data

(60) Provisional application No. 60/683,529, filed on May 19, 2005.

(51) Int. Cl.
*H01L 23/48* (2006.01)
(52) U.S. Cl. .......................... 257/786; 257/E23.079
(58) Field of Classification Search ............ 257/786, 257/E23.079
See application file for complete search history.

(56) References Cited

U.S. PATENT DOCUMENTS 6,861,740 B2 * 3/2005 Hsu ........................... 257/691
6,935,870 B2 * 8/2005 Kato et al. .................. 439/108

* cited by examiner

*Primary Examiner*—Leonardo Andújar
*Assistant Examiner*—Krista Soderholm
(74) *Attorney, Agent, or Firm*—J.C. Patents

(57) ABSTRACT

A chip structure includes a substrate with at least an arrangement of side pads on an active surface of the substrate and adjacent to one side of the active surface. The arrangement of side pads includes an outer pad row, a middle pad row and an inner pad row disposed along the extension direction of the side. The middle pad row is further away from the side than the outer pad row. The inner pad row is further away from the side than the middle pad row. Pads of the middle pad row and pads of the inner pad row are staggered. One non-signal pad of the middle pad row is located between two adjacent signal pads of the inner pad row, and one non-signal pad of the inner pad row is located between two adjacent signal pads of the middle pad row.

13 Claims, 2 Drawing Sheets

CHIP STRUCTURE WITH ARRANGEMENT OF SIDE PADS

CROSS-REFERENCE TO RELATED APPLICATION

This application claims the priority benefits of U.S. provisional application Ser. No. 60/683,529, filed on May 19, 2005. All disclosures are incorporated herewith by reference.

BACKGROUND OF THE INVENTION

1. Field of the Invention

The present invention relates to a pad arrangement of a chip. More particularly, the present invention relates to a pad arrangement of a chip suitable for forming a wire-bonding connection.

2. Description of the Related Art

With the rapid advance in electronic technologies, electronic products with more personalized characteristics, more powerful functions, a lighter, slimmer and more compact body have been developed. Thus, the circuit design and structural design of the electronic products are increasingly complicated. In the packaging of integrated circuit chip, for example, the electrical connection between the chip and the carrier is achieved through wire bonding. Typically, one end of a conductive wire is connected to a pad on an active surface of the chip while the other end of the conductive wire is connected to the contact on the carrier. Because of some limitations in the wire-bonding technique, the pads are normally disposed in the peripheral region on the active surface of the chip.

FIG. 1 is a top view of a conventional chip structure suitable of wire bonding. FIG. 2 is an enlarged view of region A in FIG. 1. As shown in FIGS. 1 and 2, the chip structure 100 has a chip 110 and a plurality of pads 120. The pads 120 are disposed on an active surface 112 of the chip 110 extending along one side 112a of the active surface 112. The pads 120 include a plurality of signal pads 122 and a plurality of non-signal pads 124. The non-signal pads 124 can be power pads or ground pads. The signal pads 122 are arranged to be adjacent and parallel to the side 112a so that a plurality of signal pad rows is formed. The non-signal pads 124 are disposed between the side 112a and the signal pads 122 and parallel to the side 112a so that a non-signal pad row is formed.

With the gradual miniaturization of the chip 110, the distance d separating two adjacent pads 120 on the active surface 112 of the chip 110 is reduced. Therefore, as these pads 120 on the chip 110 are electrically connected to a carrier (not shown) through wire bonding, the distance between the signal wires (not shown) connected to two adjacent signal pad 122 is also reduced. When the distance separating two adjacent signal wires is too short, electromagnetic coupling between two signal wires will be intense. Under such condition, a signal traveling along one of the signal wires will lead to some unwanted cross talk with an adjacent signal wire and a lowering of signal transmission quality. In a high-frequency and high-speed transmission environment, the cross talk may lead to data reading errors and faults in operations.

SUMMARY OF THE INVENTION

The invention provides a chip structure with an arrangement of side pads suitable for wire bonding. The chip structure comprises a substrate and at least an arrangement of side pads. The substrate has an active surface. The arrangement of side pads is disposed on the active surface of the chip adjacent to one side of the active surface. The arrangement of side pads at least includes an outer pad row, a middle pad row and an inner pad row. The outer pad row has a plurality of outer pads disposed along the extension direction of the side. The outer pads include a plurality of outer non-signal pads. The middle pad row is disposed further away from the side of the active surface than the outer pad row. The middle pad row has a plurality of middle pads arranged along the extension direction of the side. The middle pads include a plurality of first signal pads and a plurality of first non-signal pads. Furthermore, each of the first signal pads is adjacent to one of the first non-signal pads. The inner pad row is disposed further away from the side of the active surface than the middle pad row. The inner pad row has a plurality of inner pads arranged along the extension direction of the side. The inner pads include a plurality of second signal pads and a plurality of second non-signal pads. Furthermore, each of the second signals pad is adjacent to one of the second non-signal pad. The pads of the middle pad row and the pads in the inner pad row are staggered so that each of the first signal pads is adjacent to one of the second non-signal pads and each of the second signal pads is adjacent to one of the first non-signal pads.

The present invention also provides an alternative chip structure with an arrangement of side pads suitable for wire bonding. The chip structure comprises a substrate with at least an arrangement of side pads. The substrate has an active surface. The arrangement of side pads is disposed on the active surface of the chip adjacent to one side of the active surface. The arrangement of side pads at least includes an outer pad row, a middle pad row and an inner pad row. The outer pad row has a plurality of outer pads disposed along the extension direction of the side. The outer pads include at least four outer non-signal pads. The middle pad row is disposed further away from the side of the active surface than the outer pad row. The middle pad row has a plurality of middle pads arranged along the extension direction of the side. The middle pads include at least a first signal pad, a second signal pad and a first non-signal pad. The first non-signal pad is disposed between the first signal pad and the second signal pad. The inner pad row is disposed further away from the side of the active surface than the middle pad row. The inner pad row has a plurality of inner pads arranged along the extension direction of the side. The inner pads include at least a third signal pad, a fourth signal pad and a second non-signal pad. The third signal pad is disposed between the fourth signal pad and the second non-signal pad. The pads of the middle pad row and the pads of the outer pad row are staggered. Similarly, the pads of the middle pad row and the pads of the inner pad row are staggered.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
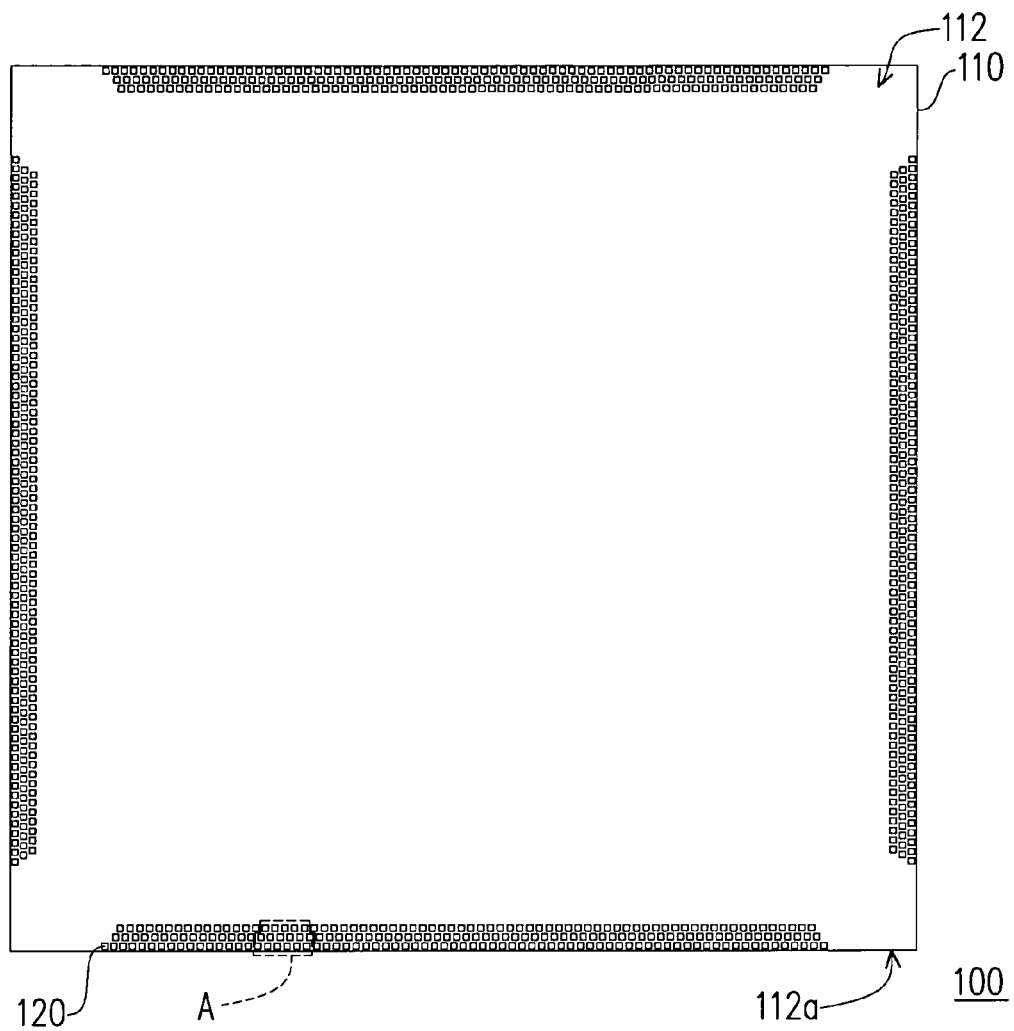
FIG. 1 is a top view of a conventional chip structure suitable of wire bonding.
Figure 2:
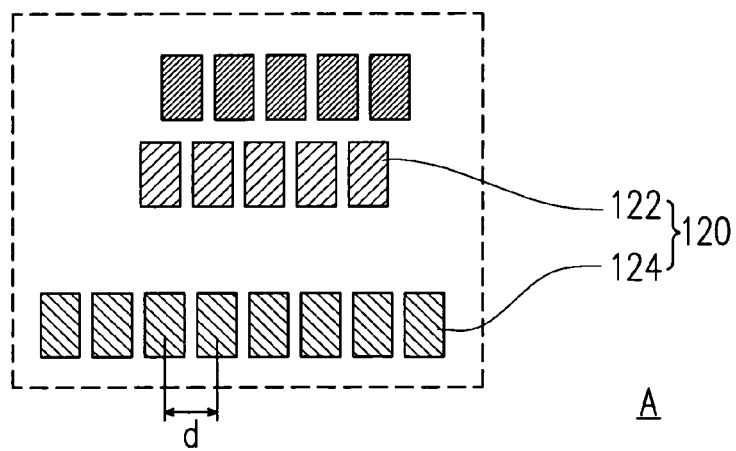
FIG. 2 is an enlarged view of region A in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 3:
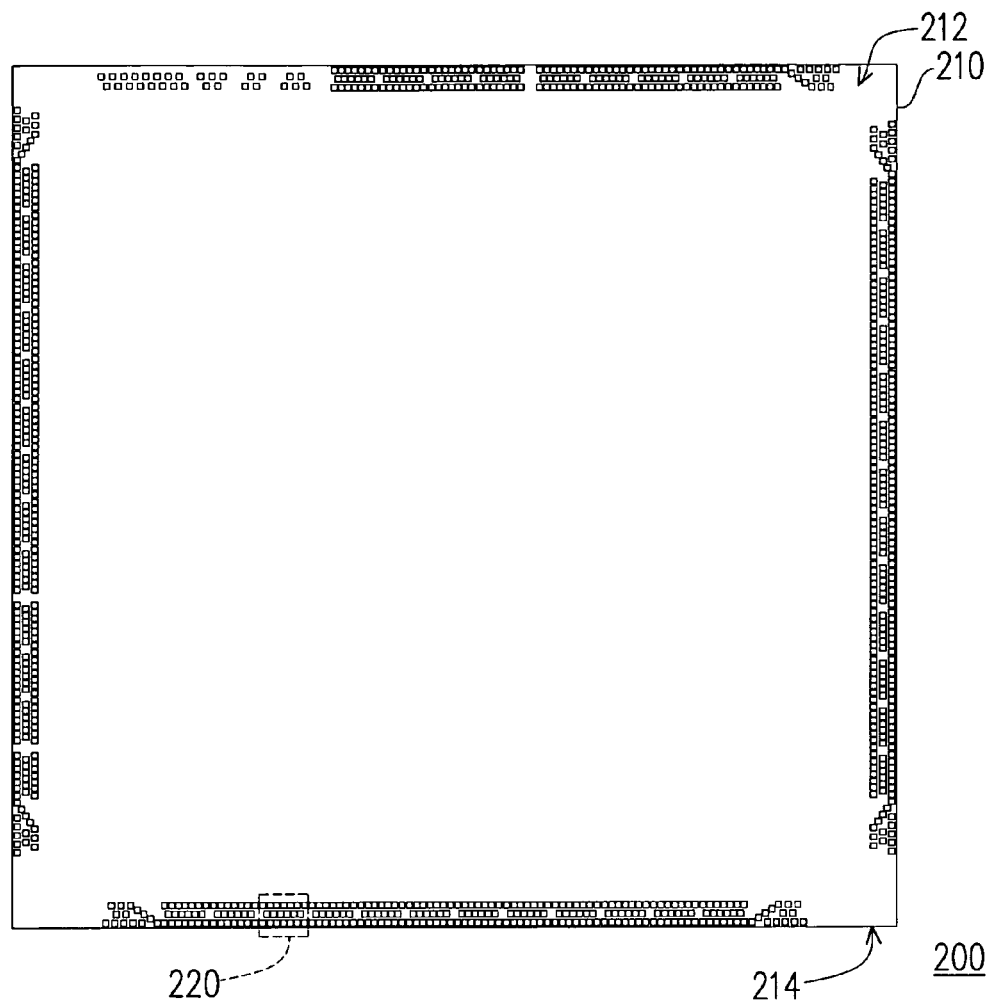
FIG. 3 is a top view of a chip structure suitable of wire bonding according to one embodiment of the present invention.
Figure 4:
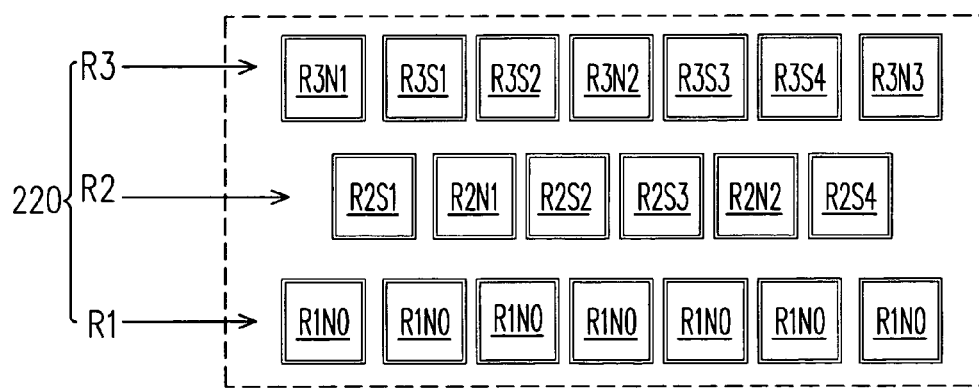
FIG. 4 is an enlarged view of the arrangement of side pads in FIG. 3.

FIG. 3 is a top view of a chip structure suitable of wire bonding according to one embodiment of the present invention. FIG. 4 is an enlarged view of the arrangement of side pads in FIG. 3. As shown in FIGS. 3 and 4, the chip structure 200 in the present embodiment is suitable for performing a wire bonding operation. The chip structure 200 includes a substrate 210, which is made of silicon for example, and at least an arrangement of side pads 220. The arrangement of side pads 220 is disposed on an active surface 212 of the substrate 210 adjacent to at least one side 214. The arrangement of side pads 220 includes at least an outer pad row R1, a middle pad row R2 and an inner pad row R3.

The outer pad row R1 has a plurality of outer pads disposed along an extension direction parallel to the side 214. The outer pads include at least four outer non-signal pads R1N0. Each of the outer non-signal pads R1N0 can be a power pad, a ground pad or other non-signal transmission pad.

The middle pad row R2 is located further away from the side 214 than the outer pad row R1. The middle pad row R2 also extends in a direction parallel to the side 214 and comprises a first signal pad R2S1, a second signal pad R2S2 and a first non-signal pad R2N1. The first non-signal pad R2N1 is located between the first signal pad R2S1 and the second signal pad R2S2. The first non-signal pad R2N1 can be a power pad, a ground pad or other non-signal transmission pad.

The inner pad row R3 is located further away from the side 214 than the middle pad row R2. The inner pad row R3 also extends in a direction parallel to the side 214 and comprises a plurality of inner pads. The inner pads include at least a third signal pad R3S1, a fourth signal pad R3S2 and a second non-signal pad R3N1. The third signal pad R3S1 is located between the fourth signal pad R3S2 and the second non-signal pad R3N1. The second non-signal pad R3N1 can be a power pad, a ground pad or other non-signal transmission pad.

The middle pads in the middle pad row R2 and the outer pads in the outer pad row R1 are staggered, and similarly, the middle pads in the middle pad row R2 and the inner pads in the inner pad row R3 are staggered. The first non-signal pad R2N is in a staggered position with respect to the third signal pad R3S1 and the fourth signal pad R3S2. The first signal pad R2S1 is in a staggered position with respect to the third signal pad R3S1 and the second non-signal pad R3N1.

According to the aforementioned pad design, when the wire bonding technique is applied to connect a plurality of conductive wires to the first signal pad R2S1, the second signal pad R2S2, the third signal pad R3S1 and the fourth signal pad R3S2; a plurality of conductive wires is connected to the first non-signal pad R2N1 and the second non-signal pad R3N1; a non-signal conductive wire will pass through every pair of adjacent signal conductive wires. For example, the non-signal conductive wire corresponding to the first non-signal pad R2N1 is between the signal conductive wires that connect to the third signal pad R3S1 and the fourth signal pad R3S2 respectively.

In addition, the length of the outer pad row R1 in the present embodiment can be extended to meet particular requirements by repeating the arrangement of the first signal pad R2S1, the second signal pad R2S2 and the first non-signal pad R2N1 in the aforementioned middle pad row R2 and repeating the arrangement of the third signal pad R3S1, the fourth signal pad R3S2 and the second non-signal pad R3N1 in the aforementioned inner pad row R3. In other words, the length of the arrangement of side pads 220 can be flexibly adjusted.

When the number of outer non-signal pads R1N0 in the outer pad row R1 increases from four to seven for the arrangement of side pads 220, the middle pads in the middle pad row R2 further includes a fifth signal pad R2S3, a third non-signal pad R2N2 and a sixth signal pad R2S4. Similar to the aforementioned arrangement of the signal pad and the non-signal pad in the middle pad row R2, the fifth signal pad R2S3 is disposed next to the second signal pad R2S2, and the third non-signal pad R2N2 is located between the fifth signal pad R2S3 and the sixth signal pad R2S4. Obviously, the third non-signal pad R2N2 can be a power pad, a ground pad or other non-signal transmission pad.

In addition, the inner pads in the inner pad row R3 may further include a fourth non-signal pad R3N2, a seventh signal pad R3S3 and an eighth signal pad R3S4. Similar to the aforementioned arrangement of the signal pad and the non-signal pad in the inner pad row R3, the fourth non-signal pad R3N2 is next to the fourth signal pad R3S2 and the seventh signal pad R3S3 is disposed between the fourth non-signal pad R3N2 and the eight signal pad R3S4. Furthermore, the inner pad row R3 also includes a fifth non-signal pad R3N3 adjacent to the eighth signal pad R3S4. Obviously, the fourth non-signal pad R3N2 can be a power pad, a ground pad or other non-signal transmission pad.

Similarly, the third non-signal pad R2N2 is in a staggered position between the seventh signal pad R3S3 and the eighth signal pad R3S4 and the fifth signal pad R2S3 is in a staggered position between the seventh signal pad R3S3 and the fourth signal pad R3N2. Furthermore, the fourth signal pad R3N2 is in a staggered position between the third non-signal pad R2S2 and the fifth signal pad R2S3.

In summary, a plurality of signal wires is used in the present invention to connect the signal pads to the carrier and a plurality of non-signal wires is used to connect the non-signal pads to the carrier in the chip structure of the present invention. Due to the special arrangement of the pads, there is a non-signal wire between every pair of adjacent signal wires. Therefore, the present invention can lower the inductivity and capacitance coupling between signals. Furthermore, the present invention can also reduce the high inductance resulting from an excess circuit current pathway when the signal passes through the signal wire. In other words, impedance mismatch problem is also minimized. In addition, the present invention can also decrease the amount of cross talk between signals so that the transmission quality of signal is improved. Moreover, the present invention can lower the insertion loss when operating at a high frequency. Ultimately, high frequency signals can be transmitted with little distortion and loss.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A chip structure with an arrangement of side pads suitable for wire bonding connection, the chip structure comprising:
   a substrate having an active surface; and
   at least an arrangement of side pads disposed on the active surface adjacent to one side of the active surface, the arrangement of side pads includes at least:
      an outer pad row having a plurality of outer pads disposed along the extension direction of the side, wherein the outer pads includes a plurality of outer non-signal pads;
      a middle pad row disposed further away from the side of the active surface than the outer pad row and having a plurality of middle pads disposed along the extension direction of the side, wherein the middle pads includes a plurality of first signal pads and a plurality of first non-signal pads, and one side of each of the first signal pads is adjacent to one of the first non-signal pads; and
      an inner pad row disposed further away from the side than the middle pad row and having a plurality of inner pads disposed along the extension direction of the side, wherein the inner pads includes a plurality of second signal pads and a plurality of second non-signal pads, and one side of each second signal pad is adjacent to one of the second non-signal pads,
   wherein the middle pads in the middle pad row and the inner pads in the inner pad row are staggered such that each of the first signal pads is adjacent to one of the second non-signal pads and each of the second signal pads is adjacent to one of the first non-signal pads.

2. The chip structure of claim 1, wherein the outer non-signal pads, the first non-signal pads and the second non-signal pads are power pads or ground pads.

3. The chip structure of claim 1, wherein the first non-signal pads and the second signal pads are staggered.

4. The chip structure of claim 1, wherein the second non-signal pads are in a staggered position relative to the first signal pads.

5. A chip structure with an arrangement of side pads suitable for wire bonding connection, the chip structure comprising:
   a substrate having an active surface; and
   at least an arrangement of side pads disposed on the active surface adjacent to one side of the active surface, the arrangement of side pads includes at least:
      an outer pad row having a plurality of outer pads disposed along the extension direction of the side, wherein the outer pads include at least four outer non-signal pads;
      a middle pad row disposed further away from the side of the active surface than the outer pad row and having a plurality of middle pads disposed along the extension direction of the side, wherein the middle pads include at least a first signal pad, a second signal pad and a first non-signal pad such that the first non-signal pad is located between the first signal pad and the second signal pad; and
      an inner pad row disposed further away from the side than the middle pad row and having a plurality of inner pads disposed along the extension direction of the side, wherein the inner pads include at least a third signal pad, a fourth signal pad and a second non-signal pad such that the third signal pad is located between the fourth signal pad and the second non-signal pad,
   wherein the middle pads in the middle pad row and the outer pads in the outer pad row are staggered, and the middle pads in the middle pad row and the inner pads in the inner pad row are staggered.

6. The chip structure of claim 5, wherein the outer non-signal pads, the first non-signal pad and the second non-signal pad are power pads or ground pads.

7. The chip structure of claim 5, wherein the first non-signal pad is in a staggered position between the third signal pad and the fourth signal pad.

8. The chip structure of claim 5, wherein the first signal pad is in a staggered position between the third signal pad and the second non-signal pad.

9. The chip structure of claim 5, wherein,
   the outer pads include seven outer non-signal pads;
   the middle pads further include a fifth signal pad, a third non-signal pad and a sixth signal pad disposed in sequence on one side of the second signal pad; and
   the inner pads further include a fourth non-signal pad, a seventh signal pad, an eighth signal pad and a fifth non-signal pad disposed in sequence on one side of the fourth signal pad.

10. The chip structure of claim 9, wherein the third non-signal pad is located between the fifth signal pad and the sixth signal pad.

11. The chip structure of claim 9, wherein the seventh signal pad is located between the fourth non-signal pad and the eighth signal pad, and the eighth signal pad is located between the fifth non-signal pad and the seventh signal pad.

12. The chip structure of claim 9, wherein the third non-signal pad is in a staggered position between the seventh signal pad and the eighth signal pad.

13. The chip structure of claim 9, wherein the fourth non-signal pad is in a staggered position between the second signal pad and the fifth signal pad.

* * * * *